(12) United States Patent
Kameshiro et al.

(10) Patent No.: US 8,890,169 B2
(45) Date of Patent: Nov. 18, 2014

(54) SEMICONDUCTOR DEVICE

(75) Inventors: Norifumi Kameshiro, Tokyo (JP);
Haruka Shimizu, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 20 days.

(21) Appl. No.: 13/883,572

(22) PCT Filed: Nov. 8, 2010

(86) PCT No.: PCT/JP2010/069855
§ 371 (c)(1),
(2), (4) Date: Jul. 16, 2013

(87) PCT Pub. No.: WO2012/063310
PCT Pub. Date: May 18, 2012

(65) Prior Publication Data
US 2013/0285071 A1   Oct. 31, 2013

(30) Foreign Application Priority Data

Nov. 8, 2010 (WO) .................. PCT/JP2010/069855

(51) Int. Cl.
*H01L 21/02* (2006.01)
*H01L 29/78* (2006.01)
(Continued)

(52) U.S. Cl.
CPC ........ *H01L 29/1608* (2013.01); *H01L 29/7811* (2013.01); *H01L 29/0878* (2013.01); *H01L 29/808* (2013.01); *H01L 29/0615* (2013.01);
(Continued)

(58) Field of Classification Search
CPC ..................... H01L 29/1608; H01L 29/66068; H01L 29/6606; H01L 29/872; H01L 29/861; H01L 29/7935

USPC ................ 257/77, 139, E21.054, 382, 29.197
See application file for complete search history.

(56) References Cited

U.S. PATENT DOCUMENTS 6,521,923 B1 * 2/2003 D'Anna et al. ................ 257/288
7,727,904 B2 * 6/2010 Das et al. ...................... 438/770
(Continued)

FOREIGN PATENT DOCUMENTS

JP    2001-196604 A    7/2001
JP    2004-319815 A    11/2004
(Continued)

OTHER PUBLICATIONS

English translation of Written Opinion of the International Searching Authority from International Application No. PCT/JP2010/069855, transmitted Feb. 8, 2011.

(Continued)

*Primary Examiner* — Michael Lebentritt
(74) *Attorney, Agent, or Firm* — Miles & Stockbridge P.C.

(57) ABSTRACT

On a front surface of a region where a junction termination extension structure of a semiconductor device using silicon carbide is formed, a structure having an n-type semiconductor region with a concentration relatively higher than a concentration of an n$^-$-type drift layer is formed. An edge of the junction termination extension structure located on a side away from an active region is surrounded from its bottom surface to its front surface by an n-type semiconductor region. By this means, it is possible to provide a device with a low resistance while ensuring a withstand voltage, or by decreasing the resistance of the device, it is possible to provide a device with low power loss.

11 Claims, 17 Drawing Sheets

(51) Int. Cl.
*H01L 29/08* (2006.01)
*H01L 29/808* (2006.01)
*H01L 29/06* (2006.01)
*H01L 29/861* (2006.01)
*H01L 29/872* (2006.01)
*H01L 29/12* (2006.01)
*H01L 29/66* (2006.01)
*H01L 29/16* (2006.01)
*H01L 29/10* (2006.01)
*H01L 29/80* (2006.01)
*H01L 29/47* (2006.01)

(52) U.S. Cl.
CPC ........... *H01L 29/861* (2013.01); *H01L 29/872* (2013.01); *H01L 29/06* (2013.01); *H01L 29/12* (2013.01); *H01L 29/78* (2013.01); *H01L 29/0843* (2013.01); *H01L 29/6606* (2013.01); *H01L 29/1095* (2013.01); *H01L 29/80* (2013.01); *H01L 29/0692* (2013.01); *H01L 29/8083* (2013.01); *H01L 29/47* (2013.01)
USPC ... 257/77; 257/136; 257/E21.054; 257/E21.382; 257/E29.197

(56) References Cited

U.S. PATENT DOCUMENTS

| | | | |
|---|---|---|---|
| 7,772,613 | B2 | 8/2010 | Shimizu et al. |
| 8,710,510 | B2* | 4/2014 | Zhang et al. .................... 257/77 |
| 2006/0065899 | A1 | 3/2006 | Hatakeyama et al. |
| 2008/0265276 | A1 | 10/2008 | Noda et al. |
| 2012/0018740 | A1* | 1/2012 | Takahashi et al. .............. 257/77 |
| 2013/0092978 | A1* | 4/2013 | Sugawara et al. ............. 257/139 |
| 2013/0292702 | A1* | 11/2013 | Horii ............................... 257/77 |
| 2014/0077232 | A1* | 3/2014 | Hino et al. ...................... 257/77 |

FOREIGN PATENT DOCUMENTS

| | | |
|---|---|---|
| JP | 2006-100593 A | 4/2006 |
| JP | 2008-277352 A | 11/2008 |
| JP | 2009-105200 A | 5/2009 |
| JP | 2010-40686 A | 2/2010 |

OTHER PUBLICATIONS

A. O. Konstantinov et al., "Ionization Rates and Critical Fields in 4H Silicon Carbide," Applied Physics Letters 71 (1), pp. 90-92, 1997.
Office Action issued Jul. 8, 2014, in Japanese Patent Application No. 2012-542735.

* cited by examiner

RESISTANCE MINIMUM CURVE
WITH TWO-LAYER DRIFT
(HIGH CONCENTRATION IN 2 μm
FROM FRONT SURFACE) LAYER

SEMICONDUCTOR DEVICE

TECHNICAL FIELD

The present invention relates to a semiconductor device, and in particular to a technology effectively applied to a termination structure of a semiconductor device using silicon carbide.

BACKGROUND ART

Silicon carbide semiconductor (SiC) has features of a larger bandgap and a higher dielectric breakdown field intensity approximately by one order of magnitude compared with silicon semiconductor, and therefore is viewed as a promising material for a power device. In particular, when a unipolar device operating only with majority carriers is used, this is effective for the reduction of loss at the time of switching operation because there is no reverse current generated at the time of switching operation in a bipolar device (process of disappearance of excessive minority carriers).

On the other hand, when a unipolar device is used, the resistance at the time of forward operation and the withstand voltage at the time of applying a reverse voltage are determined by the concentration and film thickness of a drift layer. For example, in Equation (4) of Non-Patent Document 1, an empirical formula of a maximum electric field intensity at the time of applying a reverse voltage in accordance with the impurity concentration of a substrate is disclosed. While the relation between the impurity concentration of the substrate and the maximum electric field intensity significantly depends on the fabrication method of a semiconductor device, the maximum electric field intensity is generally increased as the impurity concentration becomes higher in a specific fabrication method. However, since the slope of the electric field in the substrate becomes steeper as the impurity concentration of the substrate becomes higher, the withstand voltage at the time of applying a reverse voltage tends to be decreased. For this reason, in a tradeoff between resistance and withstand voltage, it is required to design an optimum device structure in accordance with the purpose of use.

As a method of improving the tradeoff between resistance and withstand voltage described above, a structure in which a drift layer is multilayered and its concentration and film thickness are independently controlled is disclosed (Patent Document 1). In these documents, a semiconductor layer whose impurity concentration is higher than that of the drift layer is provided on the drift layer, thereby reducing ON resistance of a vertical MOSFET. Also, for the purpose of ensuring withstand voltage of a termination part, a semiconductor layer whose impurity concentration is lower than that of the drift layer is provided on an outermost surface of a p-type guard ring forming part.

PRIOR ART DOCUMENTS

Non-Patent Documents

Non-Patent Document 1: A. O. Konstantinov et al., "Ionization rates and critical fields in 4H silicon carbide", Appl. Phys. Lett., vol. 71, pp. 90-92, 1997

Patent Documents

Patent Document 1: Japanese Patent Application Laid-Open Publication No. 2004-319815

SUMMARY OF THE INVENTION

Problems to be Solved by the Invention

It is generally known that impurities which have been ion-implanted into SiC hardly diffuse by the later annealing. For this reason, when a termination structure such as a guard ring is formed by ion implantation, a pn junction formed in a direction perpendicular to a front surface of the substrate (vertical direction) is formed as a gentle junction because of a channeling effect of the implanted impurities. On the other hand, a pn junction formed in a direction parallel to the front surface of the substrate (horizontal direction) is formed as a steep junction, and the electric field tends to be concentrated on the pn junction in the horizontal direction. In the structure of Patent Document 1 described above in which a semiconductor layer with low impurity concentration is provided on the outermost surface of the p-type guard ring forming part, the maximum electric field intensity is low in the semiconductor layer part with a low impurity concentration, and it is therefore difficult to ensure withstand voltage of the termination part at the time of applying a reverse voltage. For this reason, when trying to ensure the withstand voltage, the thickness of the drift layer has to be increased and the resistance of the drift layer is disadvantageously increased. Thus, the problem that it is difficult to decrease the device resistance and ensure the withstand voltage at the same time has been found.

Means for Solving the Problems

The present invention provides a semiconductor device in which an n-type semiconductor region with a concentration relatively higher than a concentration of an $n^-$-type drift layer is formed on a surface of a region where a junction termination extension structure of the semiconductor device is formed and the junction termination extension structure is formed inside the n-type semiconductor region. Also, another aspect of the present invention provides a semiconductor device in which an n-type semiconductor region with a concentration relatively higher than a concentration of an $n^-$-type drift layer is formed on a surface of a region where a junction termination extension structure of the semiconductor device is formed and an edge of the junction termination extension structure located on a side away from an active region is surrounded from its bottom surface to its front surface by the n-type semiconductor region.

Effects of the Invention

Since the semiconductor device of the present invention has a novel termination structure, the withstand voltage of the semiconductor device can be designed to be higher than the withstand voltage determined by the concentration of the $n^-$-type drift layer. Therefore, it is possible to provide a device with a low resistance while ensuring a withstand voltage. Alternatively, by decreasing the resistance of the device, it is possible to provide a device with low power loss.

BRIEF DESCRIPTIONS OF THE DRAWINGS

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiments, and the repetitive description thereof will be omitted. In particular, portions having corresponding function among different embodiments are denoted by the same reference symbols even if there is a difference in shape, impurity concentration, crystallinity, or others. Also, in each sectional view, only a termination portion of the semiconductor device is shown, and an electrical operation (active) region at the center of the chip is omitted.

First Embodiment

Figure 1:
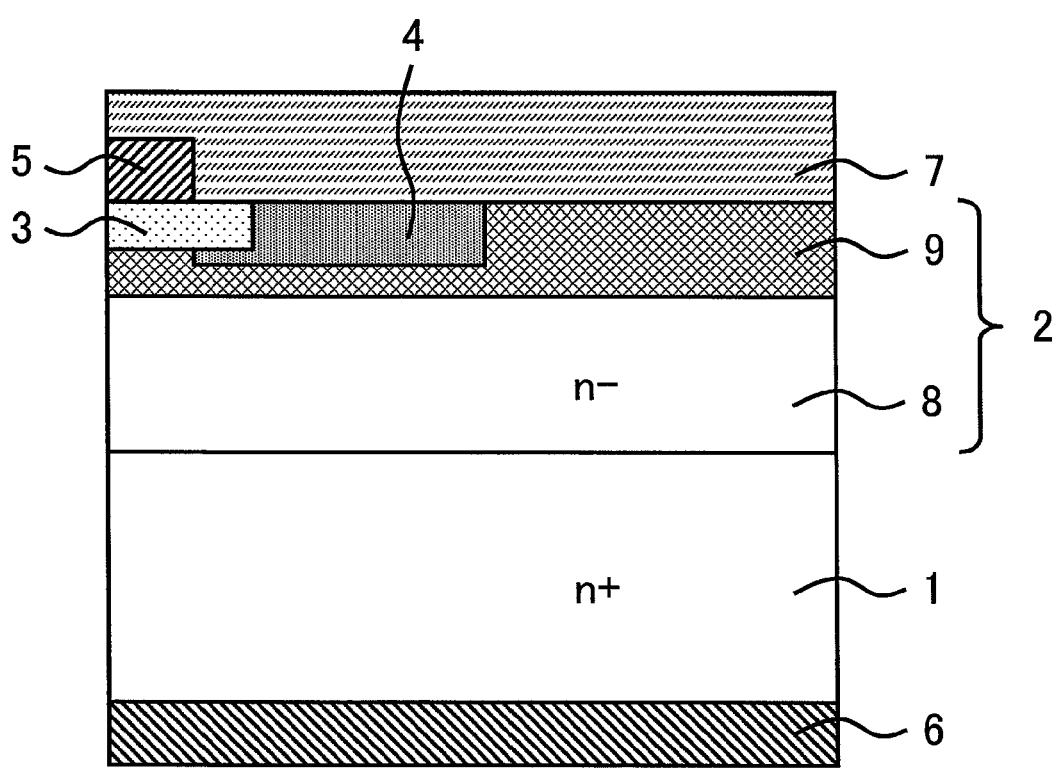
FIG. 1 is an explanatory diagram showing a sectional structure of a termination part of a semiconductor device of a first embodiment of the present invention.

FIG. 1 is an explanatory diagram showing a sectional structure of a termination part of a semiconductor device of a first embodiment of the present invention. The semiconductor device according to the first embodiment is a diode including a low impurity concentration ($n^-$-type) SiC drift layer 2 of a first conductivity type (n type) (hereinafter, referred to as "$n^-$-type SiC drift layer 2") formed on a high impurity concentration ($n^+$-type) SiC substrate 1 of the first conductivity type (hereinafter, referred to as "$n^+$-type SiC substrate 1"), a p-type semiconductor region 3 of a second conductivity type (p type) opposite to the first conductivity type, a p-type termination region (p-type semiconductor region) 4 of the second conductivity type (p type), an anode electrode 5 provided on a part of a front surface of the $n^-$-type SiC drift layer 2, a cathode electrode 6 provided on a back surface of the $n^+$-type SiC substrate 1, and an insulating film 7 provided on a part of the $n^-$-type SiC drift layer 2 and the anode electrode 5. The anode electrode 5 may be in either of Schottky contact or ohmic contact, and the active region of the diode may have any structure such as a Schottky diode, a PN diode, or a junction barrier Schottky (JBS) diode. Note that the active region mentioned here is a region where a current flows at the time of applying a voltage.

The $n^-$-type SiC drift layer 2 is configured to include two regions, that is, a low impurity concentration ($n^-$-type) first semiconductor layer 8 (first semiconductor region) of the first conductivity type (n type) formed on the high impurity concentration ($n^+$ type) SiC substrate 1 of the first conductivity type and a low impurity concentration ($n^-$ type) second semiconductor layer (second semiconductor region) 9 of the first conductivity type formed on the first semiconductor layer 8. Also, the second semiconductor layer 9 extends outside the p-type termination region 4 and makes contact with the front surface of the substrate. Here, an impurity concentration N1 of the first semiconductor layer 8 and an impurity concentration N2 of the second semiconductor layer 9 have a relation of N1<N2. Furthermore, the p-type termination region 4 is formed of a junction termination extension (JTE) structure with a single-stage or multiple-stage configuration. Still further, since the p-type semiconductor region 3 and the p-type termination region 4 are formed inside the second semiconductor layer 9, an electric field where avalanche breakdown occurs at the time of applying a reverse voltage is determined by the impurity concentration of the second semiconductor layer 9.

Figure 2:
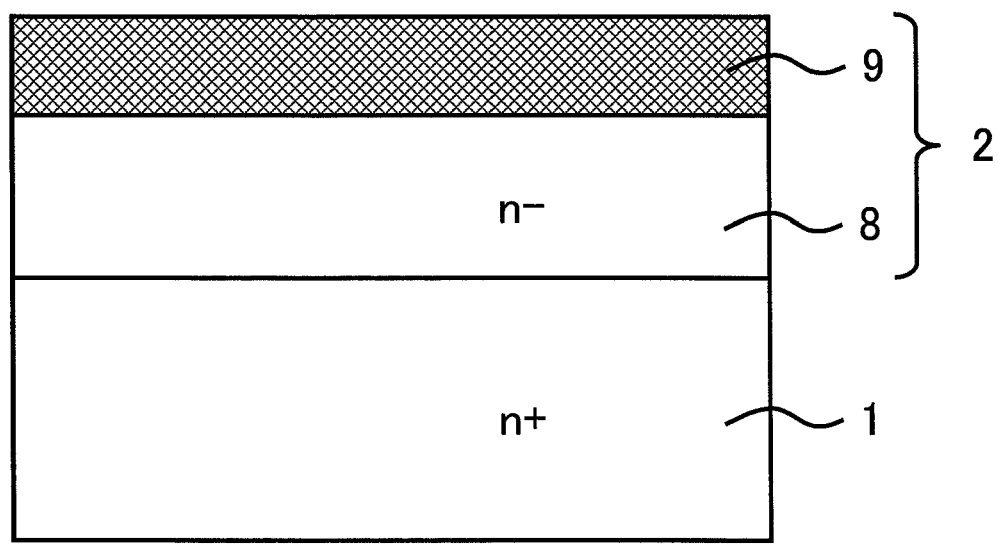
FIG. 2 is an explanatory diagram of a sectional structure in a manufacturing process showing an example of a manufacturing process of the semiconductor device of the first embodiment of the present invention.
Figure 3:
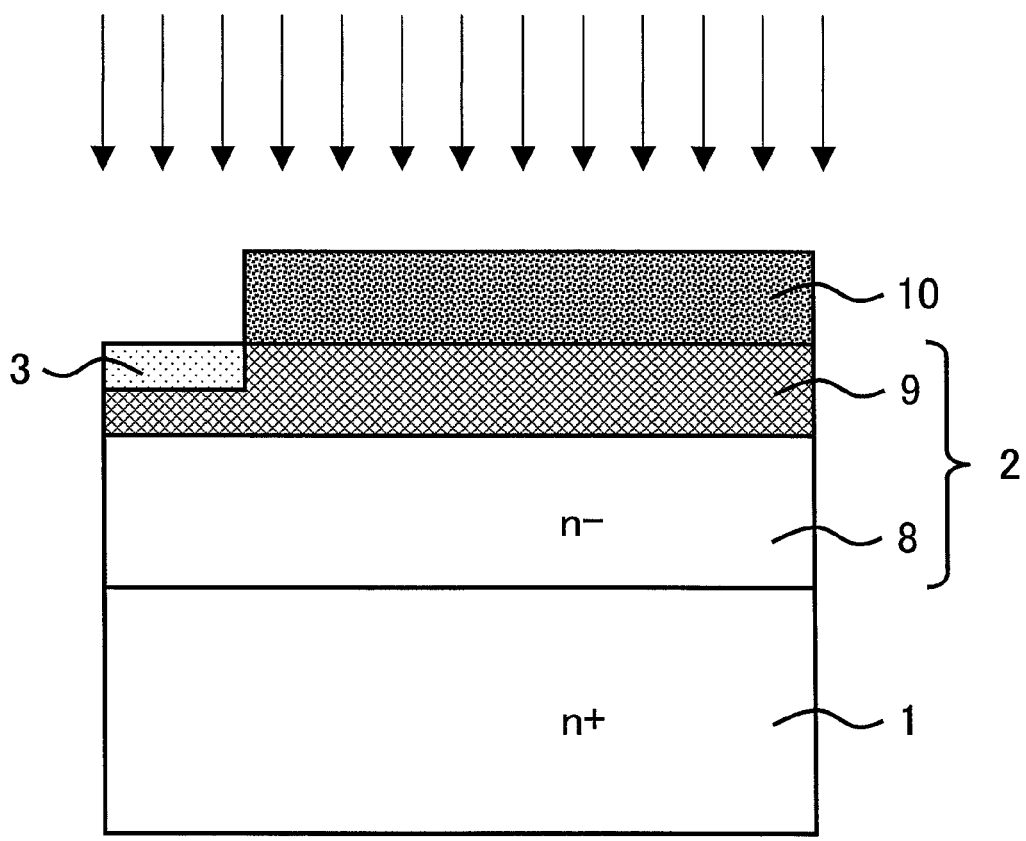
FIG. 3 is an explanatory diagram of a sectional structure showing the semiconductor device in a manufacturing process continued from FIG. 2.
Figure 4:
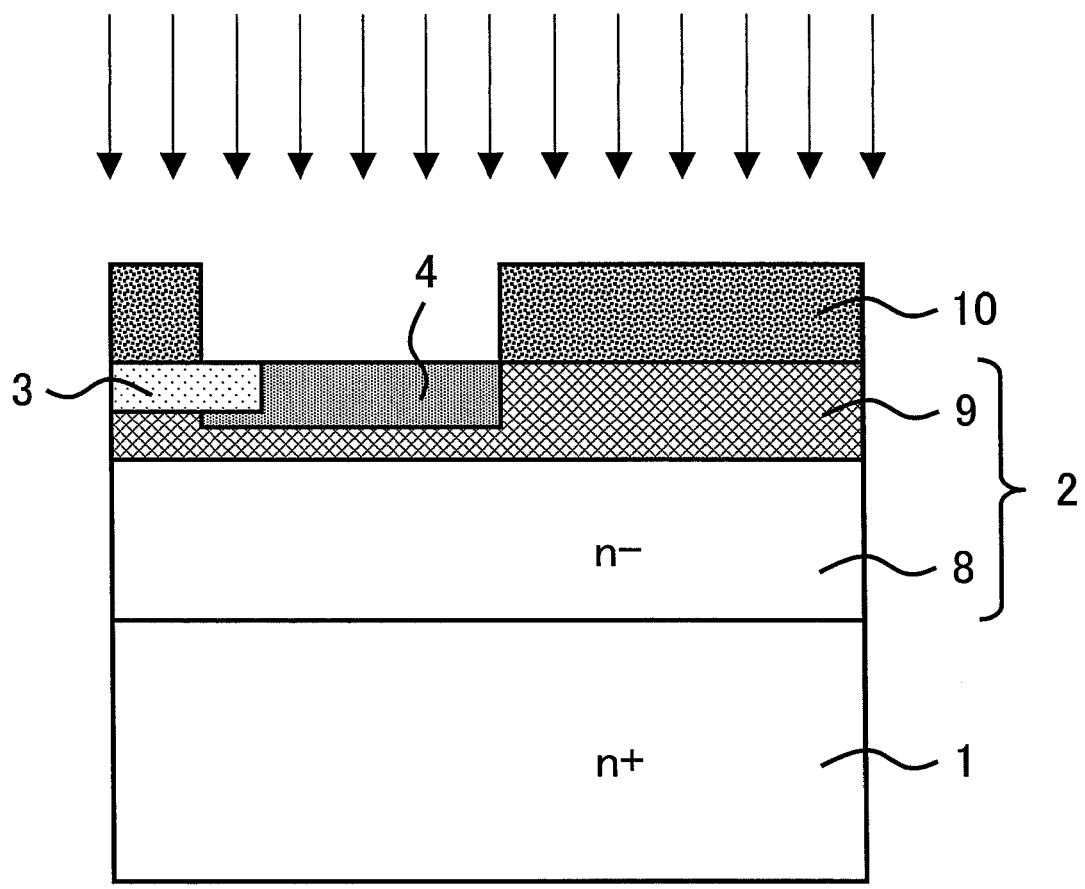
FIG. 4 is an explanatory diagram of a sectional structure showing the semiconductor device in a manufacturing process continued from FIG. 3.

FIG. 2 to FIG. 4 are explanatory diagrams of a sectional structure in a manufacturing process showing an example of a manufacturing process of the first embodiment.

First, as shown in FIG. 2, an $n^+$-type SiC substrate 1, in which the low impurity concentration $n^-$-type first semiconductor layer 8 is formed on the $n^+$-type SiC substrate 1 and the $n^-$-type second semiconductor layer 9 with an impurity concentration relatively higher than that of the $n^-$-type first semiconductor layer 8 is formed on the $n^-$-type first semiconductor layer 8 by epitaxial growth, is prepared. Here, a stacked film of the $n^-$-type first semiconductor layer 8 and the $n^-$-type second semiconductor layer 9 is defined as the $n^-$-type SiC drift layer 2.

As the impurity concentration of the $n^+$-type SiC substrate 1, a concentration in a range from about $1 \times 10^{18}$ to $1 \times 10^{19}$ cm$^{-3}$ is often used. As the main surface of the $n^+$-type SiC substrate 1, the (0001) surface, the (000-1) surface, the (11-20) surface, or others is often used, but the present invention can achieve its effects irrespectively of the selection of these main surfaces of the $n^+$-type SiC substrate 1. As the specifications of the $n^-$-type first semiconductor layer 8 on the $n^+$-type SiC substrate 1, although they depend on the specifications of a withstand voltage to be set, the impurity concentration in a range of about $1 \times 10^{15}$ to $4 \times 10^{16}$ cm$^{-3}$ in the case of the same conductivity type as that of the $n^+$-type SiC substrate 1 and the thickness in a range of about 3 to 80 μm are used.

As the specifications of the n⁻-type second semiconductor layer 9 on the n⁻-type first semiconductor layer 8, the impurity concentration is relatively higher than that of the n⁻-type first semiconductor layer 8, and it is arbitrarily set in a range where the reverse characteristic can exhibit a desired withstand voltage. Also, the thickness is not particularly limited as long as it is equal to or larger than a thickness capable of forming the p-type semiconductor region 3 and the p-type termination region 4 therein, and it is arbitrarily set in a range capable of exhibiting a desired withstand voltage.

Next, as shown in FIG. 3, a pattern is formed on a mask material 10 by general lithography and dry etching. Here, SiO₂ formed by a CVD (Chemical Vapor Deposition) method is used as the mask material 10. Although the mask material 10 is processed into a pattern in which the active region is fully open, a ring-shaped pattern in which only an active outer circumferential part is open, a striped pattern, an island-shaped pattern, a lattice-shaped pattern, or others, since the present invention relates to a termination structure of a semiconductor device, its effects can be achieved irrespective of what shape the active region is patterned into. After the pattern is formed on the mask material 10, the p-type semiconductor region 3 is formed on a front surface of the n⁻-type SiC drift layer 2 by ion implantation. An impurity concentration of the p-type semiconductor region 3 used frequently is about $10^{18}$ to $10^{20}$ cm$^{-3}$ and a junction depth thereof is about 0.3 to 2.0 μm. As a p-type dopant, Al (aluminum) or B (boron) is normally used. Here, Al is used as a dopant and implantation is carried out in multiple steps while changing the acceleration energy, thereby forming the p-type semiconductor region 3 so that the impurity concentration near the front surface is about $9 \times 10^{18}$ and the junction depth is about 0.7 μm.

Next, as shown in FIG. 4, a pattern is formed on the mask material 10 in the same manner as that of the process of forming the p-type semiconductor region 3. Here, the mask material 10 is processed so as to be overlapped with the p-type semiconductor region and be formed as a ring-shaped pattern around the outer circumferential part of the active region. An impurity concentration of the p-type termination region 4 used frequently is about $10^{17}$ to $10^{18}$ cm$^{-3}$ and a junction depth thereof is about 0.3 to 2.0 μm. Here, Al is used as a dopant and the implantation is carried out in multiple steps while changing the acceleration energy, thereby forming the p-type semiconductor region 4 so that the impurity concentration near the front surface is about $4 \times 10^{17}$ and the junction depth is about 0.9 μm. With this process, the p-type semiconductor region 3 is formed to have a structure in contact with the p-type termination region 4.

After the p-type semiconductor region 3 and the p-type termination region 4 are formed in the manner described above, activation annealing of the implanted impurities commonly used is performed to form the cathode electrode 6 in ohmic contact on the back surface of the n⁺-type SiC substrate 1 and the anode electrode 5 on the front surface of the n⁻-type SiC drift layer 2, and the anode electrode 5 is processed into a pattern with a desired size. Then, the insulating film 7 that protects the front surface is formed, and a region on the anode electrode 5 is partly opened by patterning (not shown), thereby completing the semiconductor device of the present invention shown in FIG. 1. By the patterning of the anode electrode 5, the p-type semiconductor region 3 is arranged near an edge of the anode electrode 5.

Although only the outer circumferential portion of the electrode of the diode has been described herein, a channel stopper which is normally formed on the periphery of the chip is formed before or after the steps of FIG. 3 and FIG. 4 by using general lithography and dry etching and ion implantation.

Figure 5:
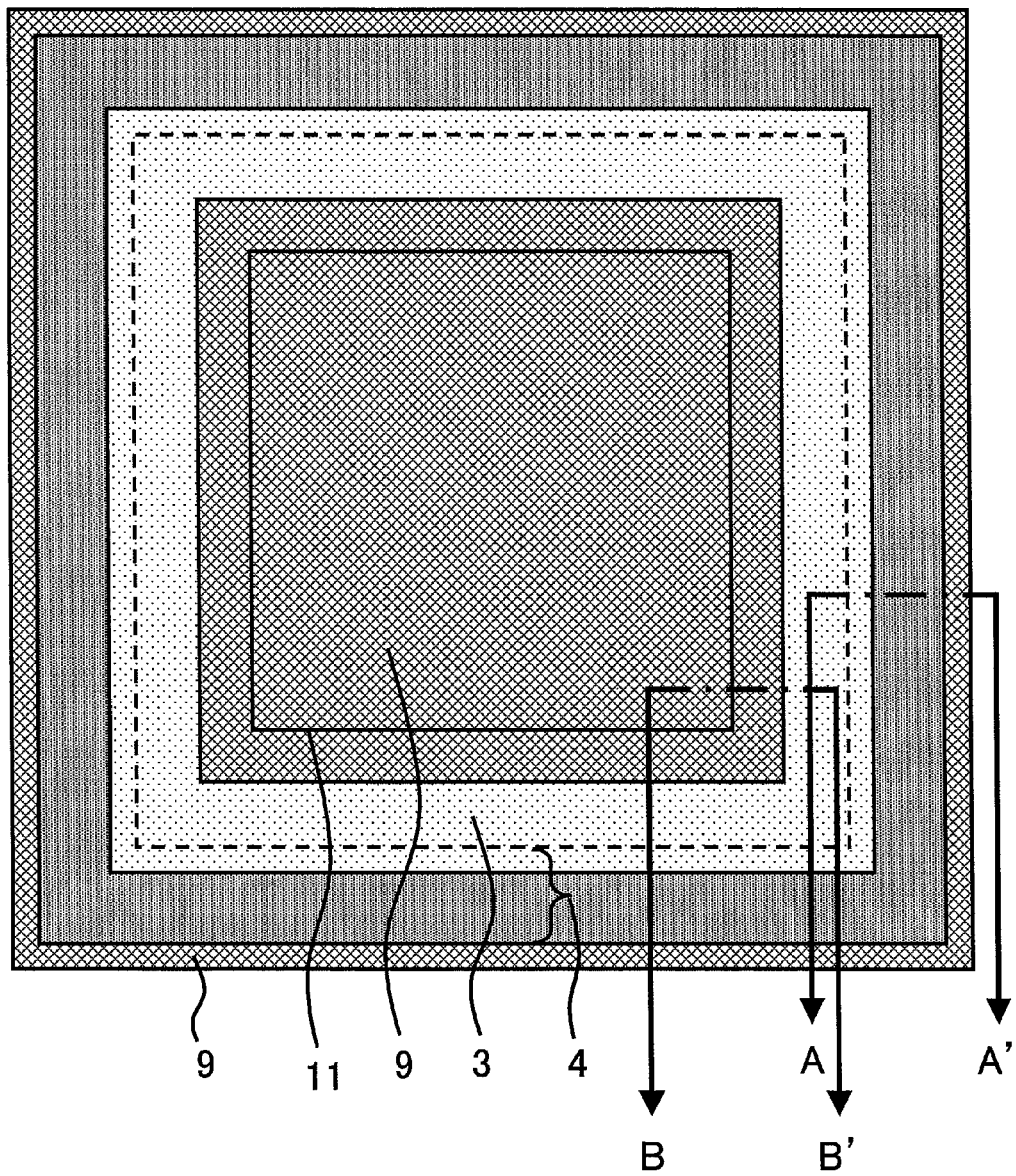
FIG. 5 is an explanatory diagram showing an upper surface structure of the semiconductor device of the first embodiment.

FIG. 5 is an explanatory diagram showing an upper surface structure of the first embodiment. Note that this upper surface view shows an arrangement relation of main portions of the semiconductor device and does not correctly show the position and dimensions of all layers. Also, in order to make the arrangement relation easily understood, some layers such as an electrode are not shown. Although the case of a Schottky diode in which the p-type semiconductor region 3 is formed to have a ring-shaped pattern in which only the active outer circumferential part is open is shown here, the diode may be a PN diode formed of a pattern in which the active region is fully open or a JBS structure diode generally formed of an island-shaped pattern, a polygonally-shaped pattern, a lattice pattern, or the like. A broken line indicates an edge of the p-type termination region 4 on an active region side. FIG. 1 is a sectional view taken along an A-A' section of FIG. 5. As shown in FIG. 5, the n⁻-type second semiconductor layer 9 extends on the outer circumferential part of the active region and is arranged also on the outer side of the p-type termination region 4. Also, FIG. 6 shows a sectional view taken along a B-B' section of FIG. 5.

Figure 6:
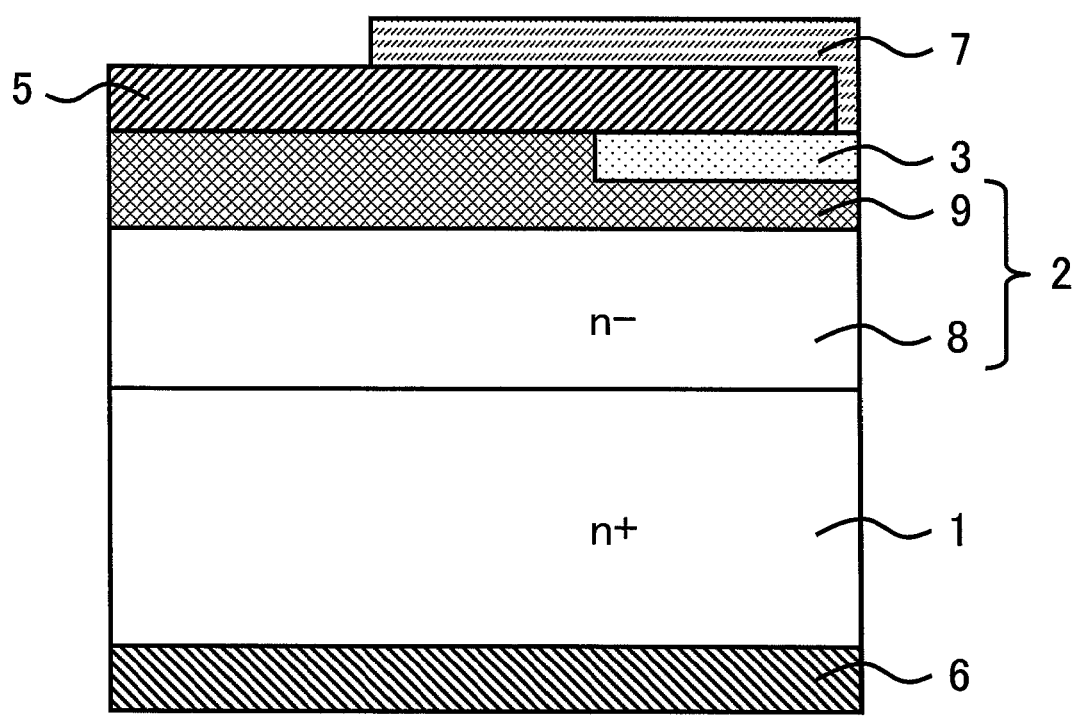
FIG. 6 is an explanatory diagram showing a sectional structure of an active region of the semiconductor device of the first embodiment.

FIG. 6 is a diagram mainly showing the inside of the active region. Although the device structure is not particularly shown therein, a well-known diode, a JFET (Junction Field-Effect Transistor), a MOSFET (Metal-Oxide-Semiconductor Field-Effect Transistor), or a MISFET (Metal-Insulator-Semiconductor Field-Effect Transistor) is formed. The case of a JFET and a MOSFET will be described further below. In the case of a JBS structure diode, which is one type of diode, a group of a plurality of p-type semiconductor regions arranged with a predetermined width and a predetermined interval is formed near the front surface of the n-type second semiconductor layer 9 and in the n⁻-type second semiconductor layer 9.

The n⁺-type SiC substrate 1 having the n⁻-type second semiconductor layer 9 formed by epitaxial growth is used in the first embodiment. Alternatively, the n⁻-type second semiconductor layer 9 may be formed by performing multi-step ion implantation of n-type impurities to the n⁻-type SiC drift layer 2. As n-type impurities, N (nitrogen) or P (phosphorus) is generally used, but another element can also be applied as long as it contributes as an n-type dopant. In this case, a region where n-type impurities are ion-implanted may be an entire surface of the n⁺-type SiC substrate 1. Also, ion implantation of n-type impurities can be performed any time before the step of activation annealing of the implanted impurities, and the n⁻-type second semiconductor layer 9 may be formed after the step of FIG. 3 or FIG. 4 is performed.

Furthermore, although SiO2 is applied as a mask material in the first embodiment, a silicon nitride film or a resist material may be applied, and any other material can be applied as long as the material serves as a mask at the time of ion implantation.

Still further, electrodes on the back surface and the front surface are formed immediately after activation annealing of implanted impurities is performed in the first embodiment. Alternatively, a sacrificial oxidation step in which an oxidation process is performed after the activation annealing of implanted impurities, thereby removing a damage layer inserted in the front surface of the n⁻ drift layer 2 may be performed.

Still further, electrodes on the back surface and the front surface are formed immediately after activation annealing of implanted impurities is performed in the first embodiment.

Figure 7:
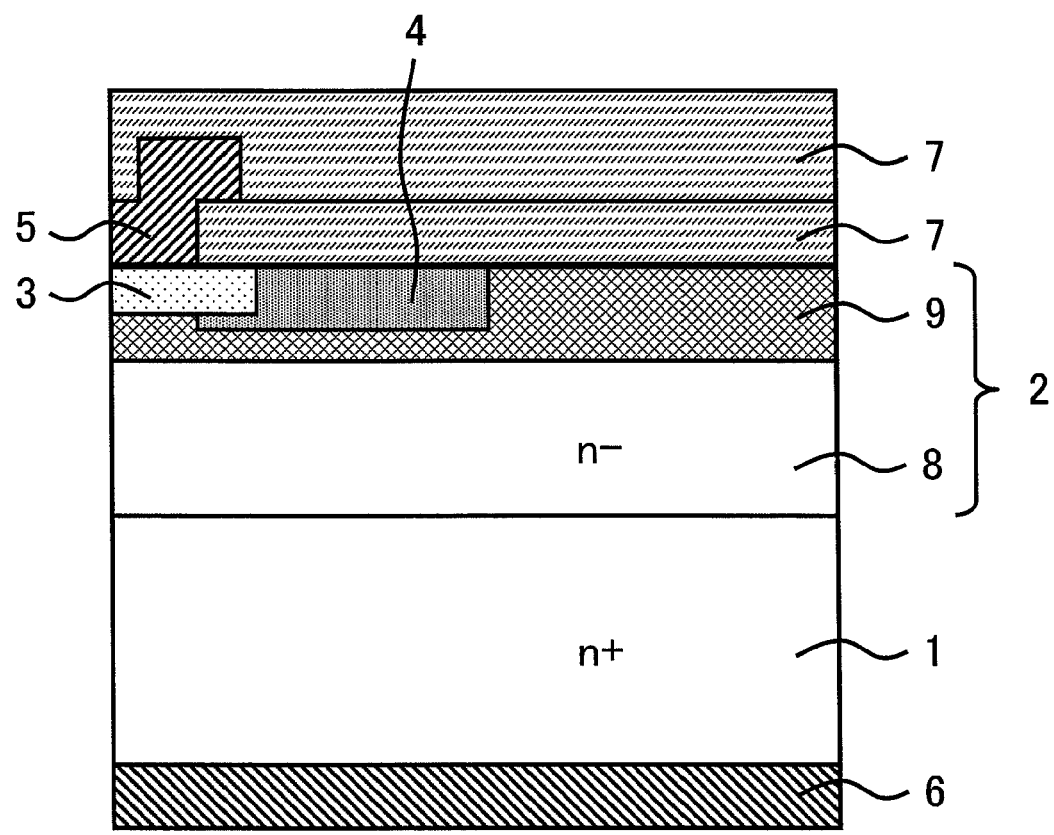
FIG. 7 is an explanatory diagram showing a sectional structure of a termination part of another semiconductor device of the first embodiment.

Alternatively, the front surface of the n⁻-type SiC drift layer 2 may be protected by forming a surface protection insulating film made of $SiO_2$ or others by a CVD method on the front surface of the n-type SiC drift layer 2. In this case, after the surface protection insulating film is formed, the insulating film is processed so that only a region where a Schottky electrode is to be formed is opened. Still further, a surface protection film may be formed after the sacrificial oxidation process described above is performed. FIG. 7 shows an explanatory diagram of a sectional structure of a termination part of the semiconductor device in this case. In this structure, the anode electrode 5 is formed so as to partially override the insulating film 7. Also in this case, the p-type semiconductor region 3 is arranged near an edge of the anode electrode 5 which does not override the insulating film 7 (edge of an anode electrode just above the p-type semiconductor region 3).

Next, an example of effects of the present invention will be described with reference to FIG. 8 to FIG. 12. FIG. 8 is an explanatory diagram showing a sectional structure and an electric field distribution of a conventional semiconductor device. The impurity concentrations of the n⁻-type SiC drift layers 2 from FIG. 8A to FIG. 8D are constant, and their film thicknesses are $t_a$ to $t_d$, respectively. The film thicknesses T of the n⁻-type SiC drift layers 2 from FIG. 8A to FIG. 8D are as in Equation 1 below.

[Equation 1]

$$Ta > Tb > Tc > Td \qquad \text{Equation 1}$$

Figure 8A:
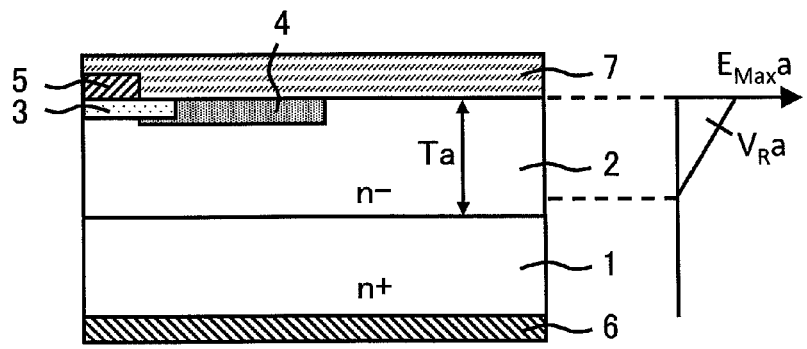
FIG. 8 is an explanatory diagram showing a sectional structure and an electric field distribution of a conventional semiconductor device.
Figure 8B:
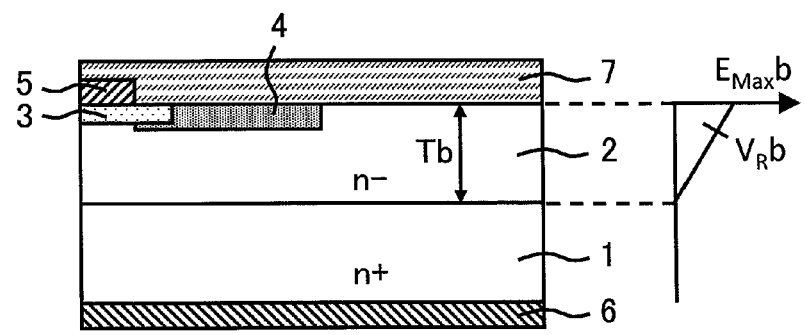
Figure 8C:
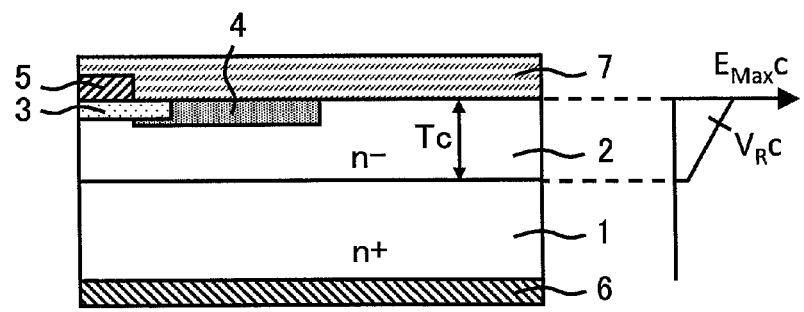
Figure 8D:
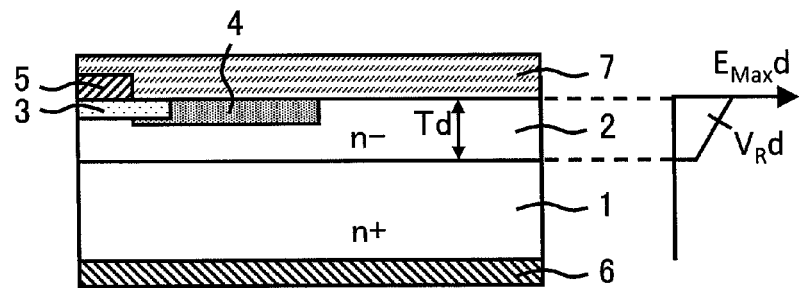

Here, FIG. 8A and FIG. 8B each show a so-called non-punch-through device, and FIG. 8C and FIG. 8D each show a so-called punch-through device. Also, Tb is set as a film thickness with which a minimum resistance as a non-punch-through type is obtained at the impurity concentration of the n⁻-type SiC drift layer 2. In this case, a relation among a maximum electric field intensity $E_{Max}$, a withstand voltage $V_R$ at the time of applying a reverse voltage, and a resistance $R_{drift}$ of the n⁻-type SiC drift layer 2 is as in Equation 2 to Equation 4 below.

[Equation 2]

$$E_{Max}a = E_{Max}b = E_{Max}c = E_{Max}d \qquad \text{Equation 2}$$

[Equation 3]

$$V_R a = V_R b > V_R c > V_R d \qquad \text{Equation 3}$$

[Equation 4]

$$R_{drift}a > R_{drift}b > R_{drift}c > R_{drift}d \qquad \text{Equation 4}$$

$E_{Max}$ is the same among the devices of FIG. 8A to FIG. 8D because it is determined by the impurity concentration of the n⁻-type SiC drift layer 2 as described above. $V_R$ is determined by the maximum electric field intensity $E_{Max}$ at the time of applying a reverse voltage and the depth to which a depletion layer spreads at that time. In FIG. 8, the area of a region surrounded by a triangle corresponds to $V_R$ in FIG. 8A and FIG. 8B. Also, in FIG. 8C and FIG. 8D, since the impurity concentration of the n⁺-type SiC substrate 1 is approximately one hundred times higher than that of the n⁻-type SiC drift layer 2 and the depletion layer hardly spreads into the n⁺-type SiC substrate 1, the area of a region surrounded by a trapezoid can be approximated to correspond to $V_R$. Since the impurity concentration of the n⁻-type SiC drift layer 2 is the same, $R_{drift}$ is increased as a film thickness T becomes larger, and is decreased as the film thickness T becomes smaller.

Figure 9:
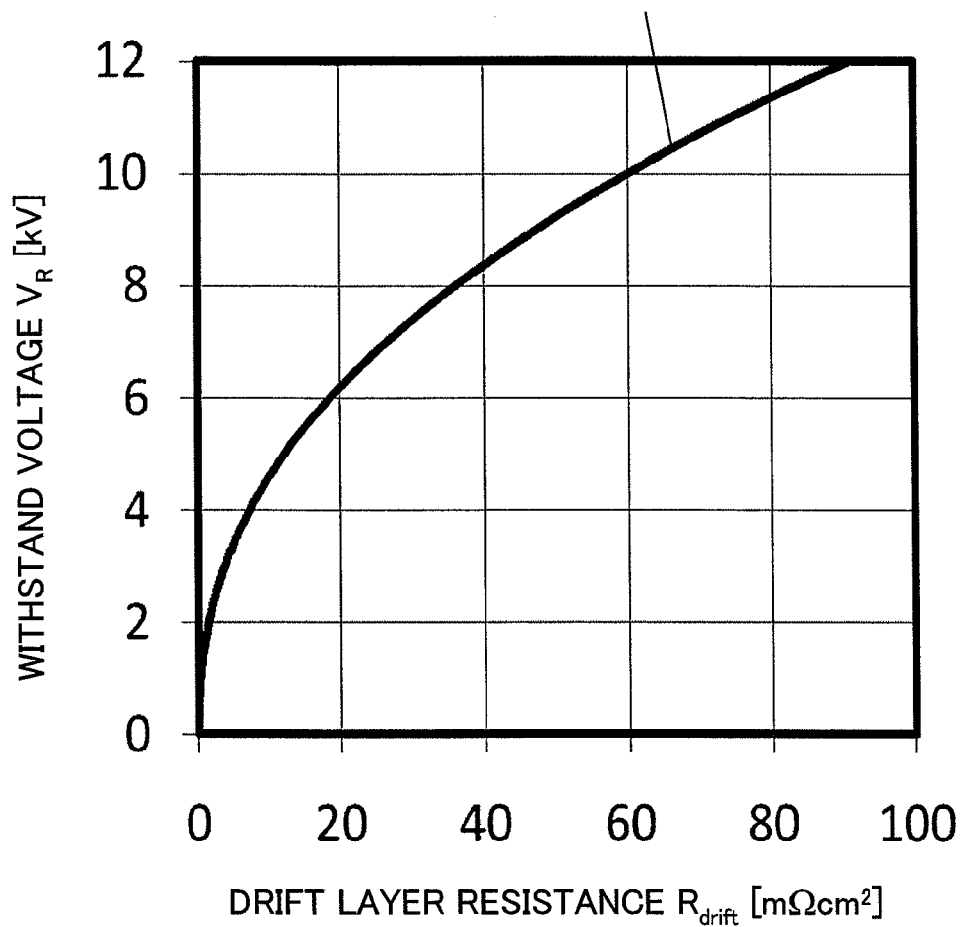
FIG. 9 is an explanatory diagram showing dependency between withstand voltage and drift layer resistance of a conventional non-punch-through device.

FIG. 9 is an explanatory diagram showing dependency between the withstand voltage $V_R$ and the resistance $R_{drift}$ of the n⁻-type SiC drift layer 2 of a conventional non-punch-through device. The maximum withstand voltage $V_R$ is determined by the impurity concentration of the n⁻-type SiC drift layer 2, and the result of provisional calculation obtained by setting the film thickness T so that the resistance is minimized as a non-punch-through device in that case is shown.

Figure 10:
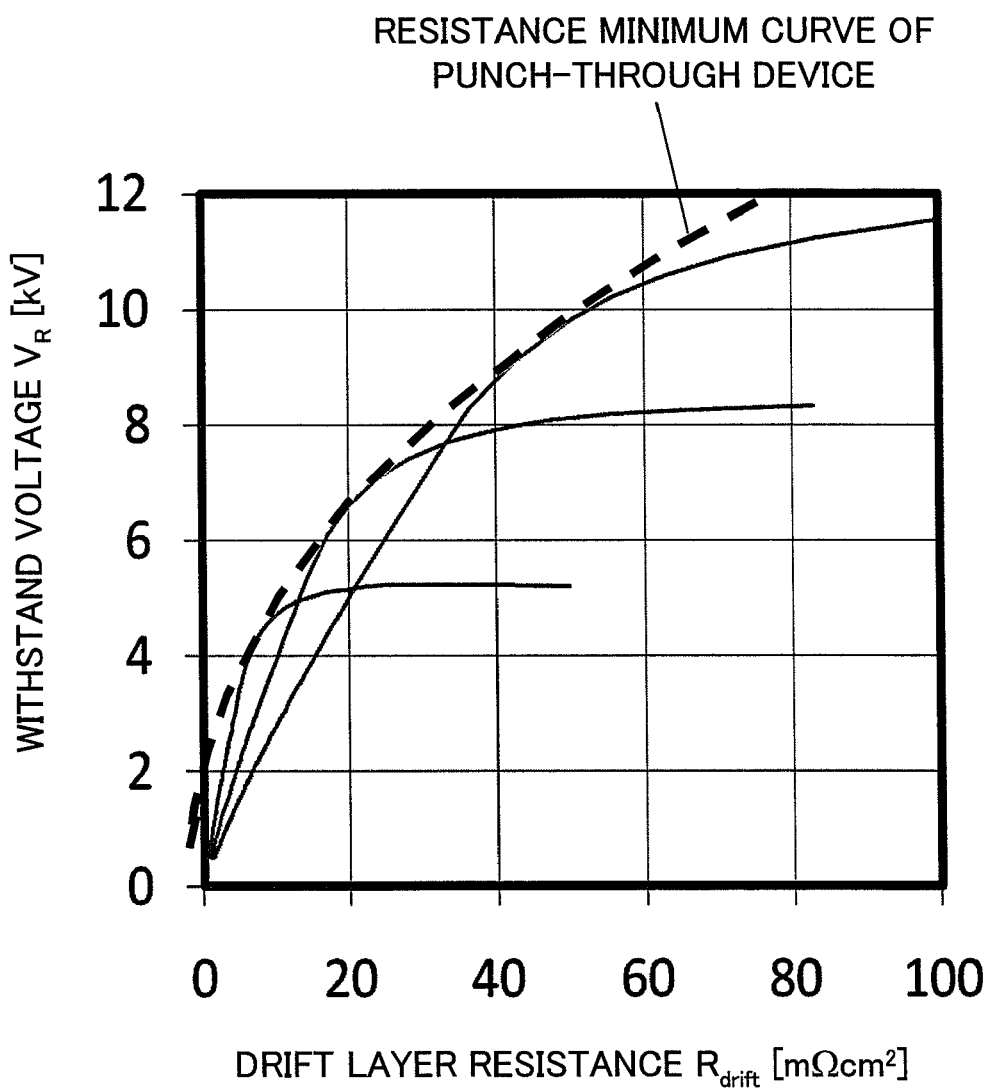
FIG. 10 is an explanatory diagram showing dependency between withstand voltage and drift layer resistance of a conventional punch-through device.

FIG. 10 is an explanatory diagram showing dependency between the withstand voltage $V_R$ and the resistance $R_{drift}$ of the n⁻-type SiC drift layer 2 of a conventional punch-through device. This is the curve estimated by provisionally calculating the maximum withstand voltages $V_R$ and the resistances $R_{drift}$ of the n⁻-type SiC drift layer 2 while varying impurity concentration with respect to the film thicknesses of the n⁻-type SiC drift layer 2 arbitrarily selected, and then linking the resistances $R_{drift}$ of the n⁻-type SiC drift layer 2 that are minimum with respect to each withstand voltage $V_R$. By comparing FIG. 9 and FIG. 10, it can be found that, when the withstand voltages are identical, the resistance $R_{drift}$ of the n⁻-type SiC drift layer 2 can be designed to be lower in the punch-through device than in the non-punch-through device. Also, this figure shows a trade-off relation between the withstand voltage $V_R$ and the resistance $R_{drift}$ of the n⁻-type SiC drift layer 2 in the conventional structural device.

Figure 11A:
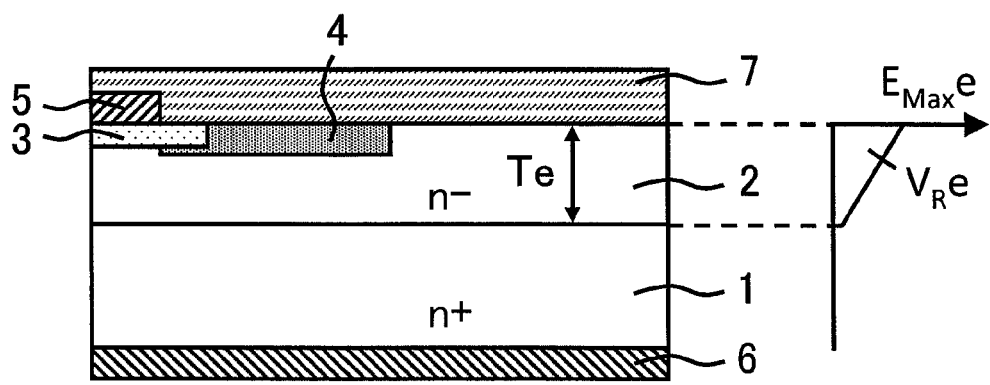
FIG. 11 is an explanatory diagram showing a sectional structure of a semiconductor device and an electric field distribution as an example of effects of the first embodiment.
Figure 11B:
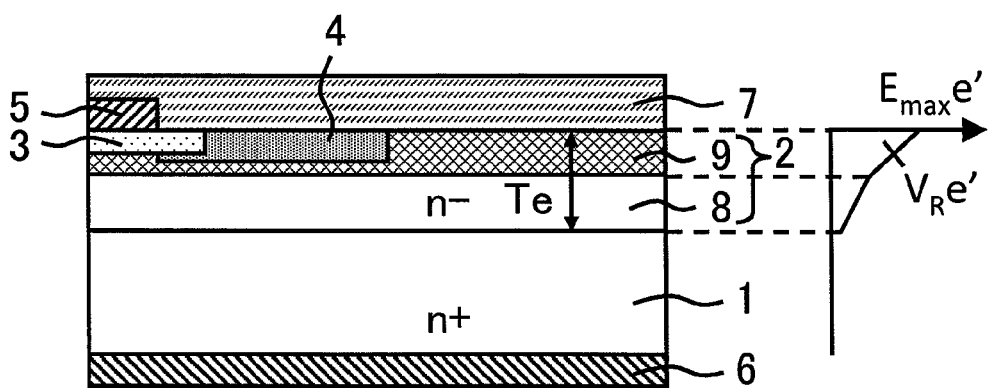

FIG. 11 is an explanatory diagram showing a sectional structure of a semiconductor device and an electric field distribution as an example of effects of the first embodiment. FIG. 11A shows a punch-through device of a conventional structure, and FIG. 11B shows a device in which the n⁻-type SiC drift layer 2 is formed to have a two-layer structure with different impurity concentrations, and the n⁻-type second semiconductor layer 9 on a front surface side has an impurity concentration higher than that of the n⁻-type first semiconductor layer 8 on an n⁺-type SiC substrate 1 side. Therefore, the maximum electric field intensity $E_{Max}$ has a relation of Equation 5 below.

[Equation 5]

$$E_{Max}e < E_{Max}e' \qquad \text{Equation 5}$$

From the relation among the Equation 5, the area of a trapezoid of FIG. 11A, and the area of a pentagon of FIG. 11B, a withstand voltage $V_R e'$ can be set to be higher than $V_R e$ by appropriately designing the impurity concentration and film thickness of the n⁻-type second semiconductor layer 9. The first embodiment has a structure in which the withstand voltage $V_R e'$ is set to be higher than $V_R e$ by using the n⁻-type second semiconductor layer 9.

Figure 12:
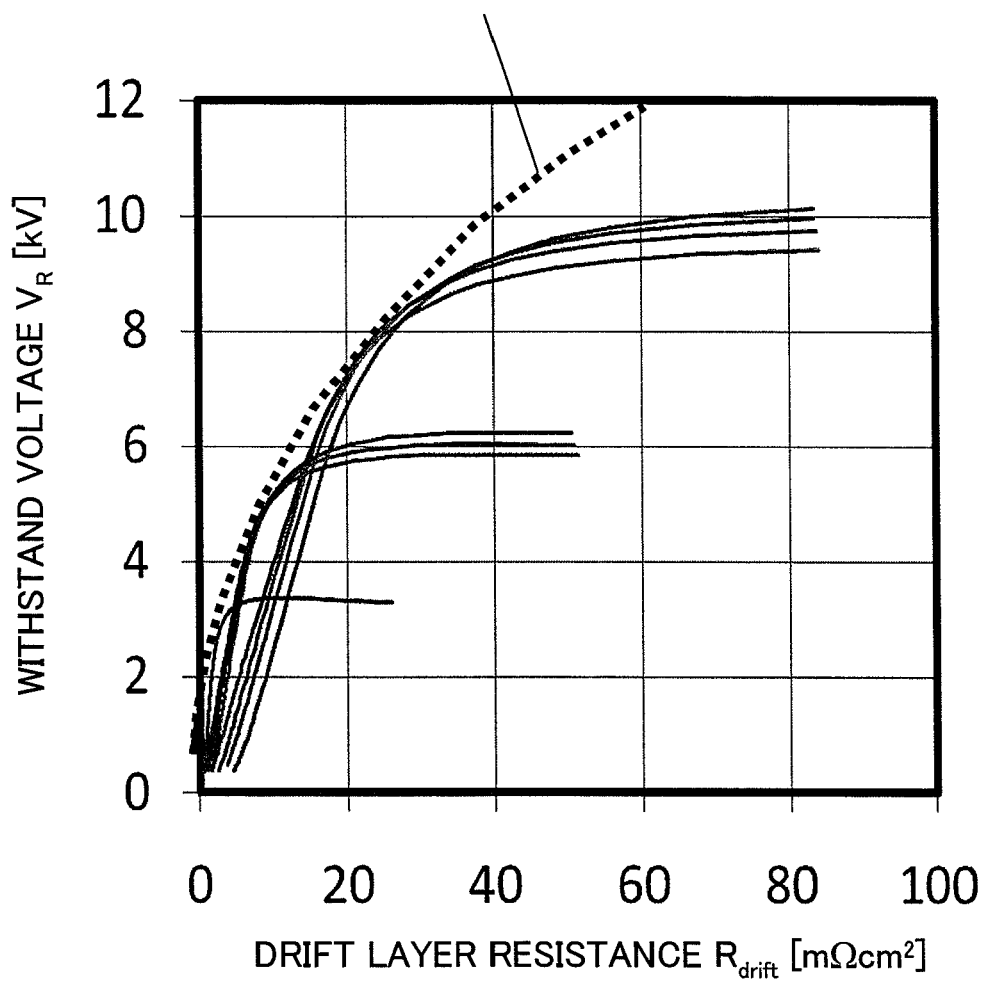
FIG. 12 is an explanatory diagram showing an effect of the first embodiment.

FIG. 12 is an explanatory diagram showing dependency between the withstand voltage $V_R$ and the resistance $R_{drift}$ of the n⁻-type SiC drift layer 2 as an example of the effects of the present invention. This is the curve estimated by provisionally calculating the maximum withstand voltages $V_R$ and the resistances $R_{drift}$ of the n⁻-type SiC drift layer 2 while varying the impurity concentration with respect to the film thicknesses of the n⁻-type first semiconductor layer 8 arbitrarily selected, fixing the film thickness of the n⁻-type second semiconductor layer 9 at 2 μm, and setting the impurity concentration thereof to be higher than that of the n⁻-type first semiconductor layer 8, and then linking the resistances $R_{drift}$ of the n⁻-type SiC drift layer 2 which are minimum with respect to each withstand voltage $V_R$. Although the optimum impurity concentration of the n⁻-type second semiconductor layer 9 differs depending on the withstand voltage $V_R$ to be set, if the withstand voltage is the same, the resistance $R_{drift}$ of the n⁻-type SiC drift layer 2 can be designed to be lower compared with the punch-through device of the conventional structure. This is because, since the maximum electric field intensity $E_{Max}$ can be increased by virtue of the structure of the present invention in which the n⁻-type second semiconductor layer 9 is added, the impurity concentration of the n⁻-type first semiconductor layer 8 can be increased or the thickness thereof can be reduced when the device with the same withstand voltage is designed. Also, in comparison with the technology disclosed in Patent Document 1, since a layer whose impurity concentration is lower than that of a drift layer is formed on the front surface of the substrate in the termination structure, the maximum electric field intensity of the front surface of the substrate is lower than $E_{Max}e$ of FIG. 11A if the impurity concentration of the drift layer is the same. For this reason, it is required to design a thick drift layer if the withstand voltage is the same, and unlike the present embodiment, it is difficult to design a high impurity concentration and a thin drift layer. Also from this, it can be found that the present invention is advantageous.

Figure 13:
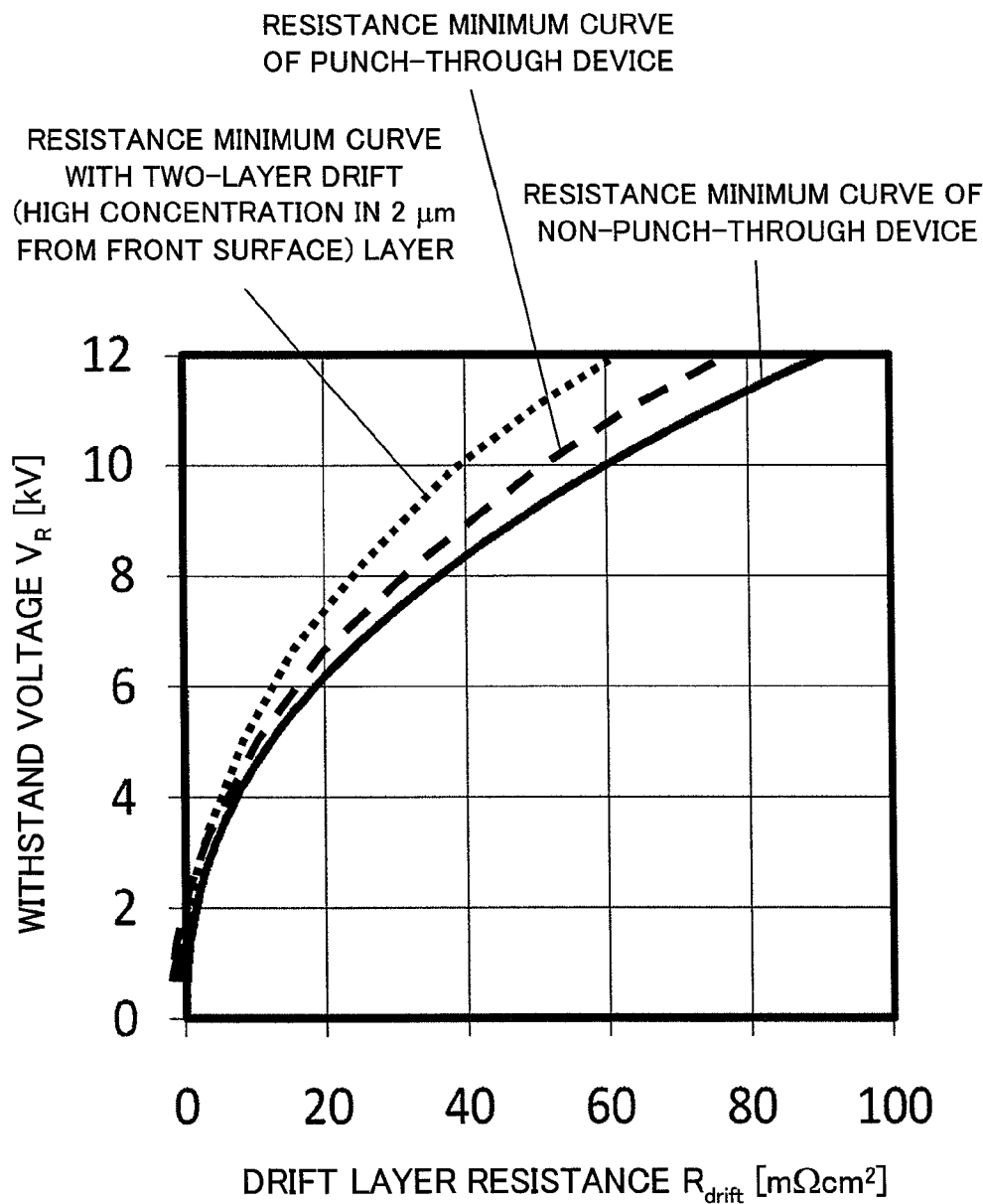
FIG. 13 is an explanatory diagram showing an effect of the first embodiment.

FIG. 13 is an explanatory diagram showing the dependency between the withstand voltage $V_R$ and the resistance $R_{drift}$ of the n⁻-type SiC drift layer 2 compared with the conventional structure as an example of the effects of the present invention. From FIG. 13, it can be found that the drift layer resistance $R_{drift}$ can be designed to be low in the structure of the present invention when the withstand voltage is the same. More specifically, by virtue of the structure of the present invention in which the n⁻-type second semiconductor layer 9 is added, it is possible to provide a device with a low resistance while ensuring a withstand voltage. Alternatively, by decreasing the resistance of the device, it is possible to provide a device with low power loss.

The case in which the film thickness of the n⁻-type second semiconductor layer 9 is 2 μm has been described in the first embodiment, but the film thickness of the n⁻-type second semiconductor layer 9 can be set to any value. In other words, the film thickness may be increased or decreased within the range where the reverse characteristic can exhibit a desired withstand voltage.

Also, according to the structure of the first embodiment, since the impurity concentration and film thickness of the n⁻-type first semiconductor layer 8 and those of the type second semiconductor layer 9 can be independently set, there is also an effect that not only the withstand voltage $V_R$ and the drift layer resistance $R_{drift}$ but also a junction capacitance of the device at the time of applying a reverse voltage can be designed together. This is because the spread of the depletion layer at the time of applying a reverse voltage can be controlled by the impurity concentrations and the film thicknesses of the n⁻-type first semiconductor layer 8 and the n⁻-type second semiconductor layer 9.

Second Embodiment

Figure 14:
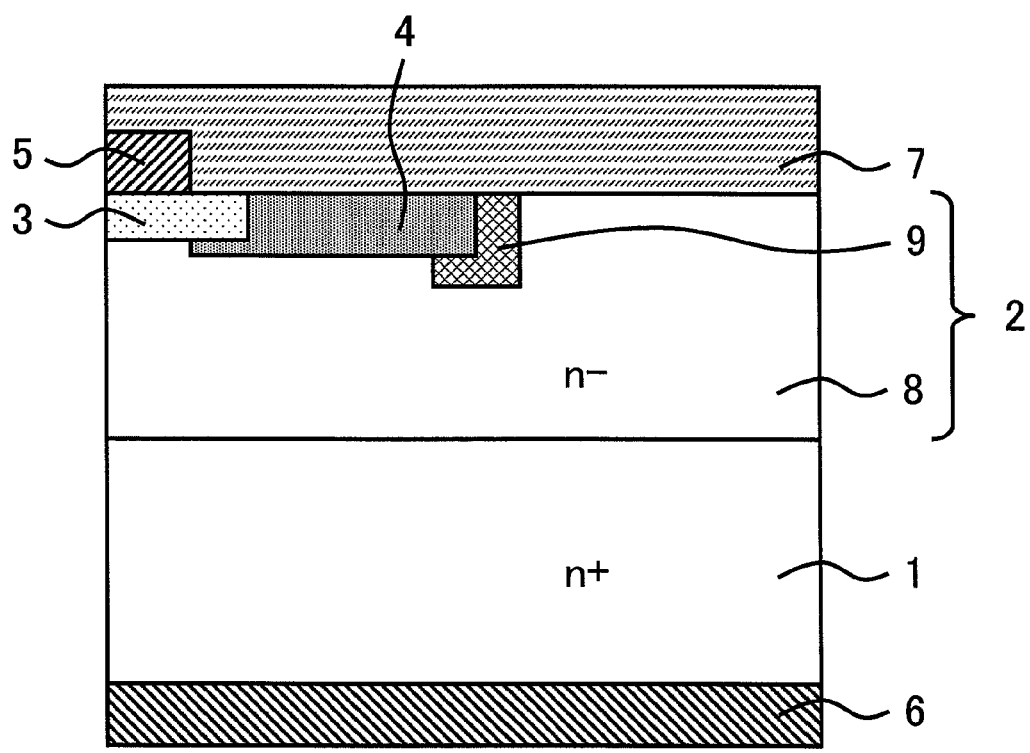
FIG. 14 is an explanatory diagram showing a sectional structure of a termination part of another semiconductor device of a second embodiment.
Figure 15:
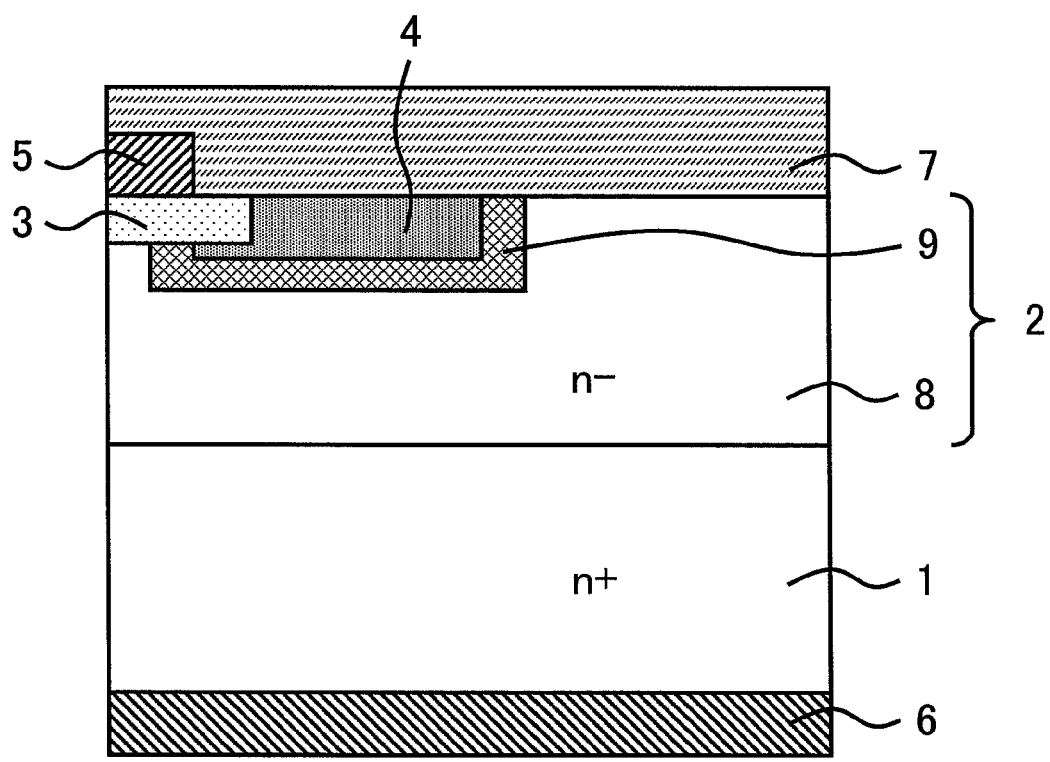
FIG. 15 is an explanatory diagram showing a sectional structure of a termination part of another semiconductor device of a second embodiment.

The n⁺-type SiC substrate 1 having the n⁻-type second semiconductor layer 9 formed on the entire upper surface of the n⁻-type SiC drift layer 2 is used in the first embodiment, but the n⁻-type second semiconductor layer 9 may be formed in a part of the region on the upper surface of the n⁻-type SiC drift layer 2 so as to cover a pn junction formed in a lateral direction. This is because the device withstand voltage at the time of applying a reverse voltage depends on the structure of the active region and the termination structure and the device withstand voltage can be improved also by the increase of the withstand voltage by the termination structure. FIG. 14 and FIG. 15 show the sectional structures in this case. In the case of these structures, in addition to the effects of the first embodiment, there is an advantage that the termination structure can be designed separately from and independently of device design.

FIG. 14 shows an example in which the n⁻-type second semiconductor layer 9 is formed on an outermost circumferential part of the termination structure. An edge of the p-type termination region 4 located on a side away from an active region is surrounded from its bottom surface to its front surface by the n⁻-type second semiconductor layer 9. On the other hand, the n⁻-type second semiconductor layer 9 does not extend to the active region, and an edge of the n⁻-type second semiconductor layer 9 is formed within a range where the p-type termination region 4 is formed in a lateral direction. By this means, the withstand voltage at the time of applying a reverse voltage can be improved separately from and independently of device design.

FIG. 15 shows an example in which the n⁻-type second semiconductor layer 9 is formed in a region covering the entire termination structure. An edge of the p-type termination region 4 located on a side away from the active region is surrounded from its bottom surface to its front surface by the n⁻-type second semiconductor layer 9, and in addition, a bottom part of the p-type termination region 4 is also surrounded by the n⁻-type second semiconductor layer 9. On the other hand, the n⁻-type second semiconductor layer 9 does not extend to the active region, and an edge of the n⁻-type second semiconductor layer 9 is formed within a range where the p-type termination region 4 is formed in a lateral direction. By this means, the withstand voltage at the time of applying a reverse voltage can be improved separately from and independently of device design. In other words, even if the drift layer is made thinner, a device with the same withstand voltage as a conventional device can be created, so that it is possible to provide a device with a low resistance while ensuring a withstand voltage, or by decreasing the resistance of the device, it is possible to provide a device with low power loss.

In a fabricating method in the case of FIG. 14 or FIG. 15, after the n⁺-type SiC substrate 1 having the n⁻-type first semiconductor layer 8 with a low impurity concentration formed on the n⁺-type SiC substrate 1 is prepared, the front surface of the n⁻-type first semiconductor layer 8 is processed to a recessed shape by general lithography and dry etching, and then the n⁻-type second semiconductor layer 9 is formed by epitaxial growth. An unwanted portion of the n⁻-type second semiconductor layer 9 formed on the n⁻-type first semiconductor layer 8 other than the recessed part is removed by general CMP (Chemical Mechanical Polishing) or etchback by dry etching, thereby preparing a substrate in place of the n⁺-type SiC substrate 1 shown in FIG. 2. Manufacturing steps thereafter can be identical to those in FIG. 3 and subsequent figures.

Third Embodiment

Figure 16:
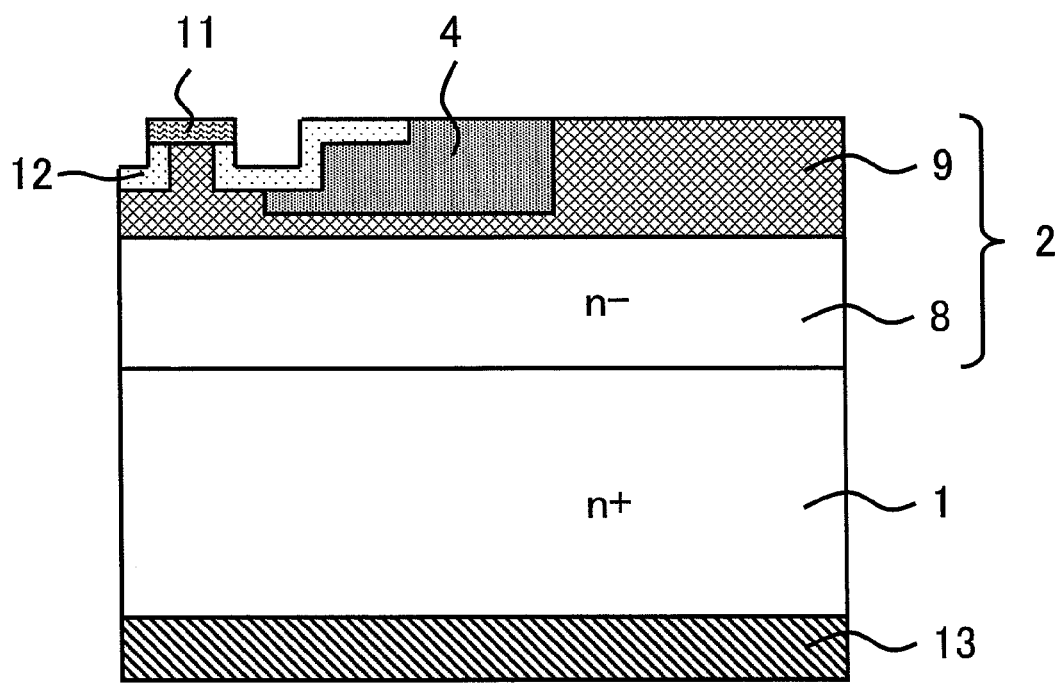
FIG. 16 is an explanatory diagram showing a sectional structure of a termination part of a semiconductor device of a third embodiment of the present invention.

FIG. 16 is an explanatory diagram showing a sectional structure of a semiconductor device of a third embodiment of the present invention. The third embodiment provides an example in which a so-called trench-gate junction field-effect transistor (JFET) is formed in an active region. For avoiding complications, the gate electrode, the source electrode, and the insulating film 7 for protecting the front surface are omitted. The semiconductor device of the third embodiment is different from a general trench-gate JFET in that a stacked film formed of the n⁻-type first semiconductor layer 8 and the n⁻-type second semiconductor layer 9 whose impurity concentration is higher than that of the n⁻-type first semiconductor layer 8 is used as the n⁻-type SiC drift layer 2 and the pn junction of a gate and the JTE where the electric field may possibly concentrate are formed in the n⁻-type second semiconductor layer 9. The manufacturing method and structure other than that may be the same as those of the general trench-gate JFET.

According to the structure of the third embodiment, since the impurity concentration of the region where a channel is formed is high, the channel resistance can be reduced, and the maximum electric field intensity $E_{Max}$ can be made higher than $E_{Max}$ of the n⁻-type first semiconductor layer 8, and therefore, the tradeoff between the withstand voltage and the resistance can be improved. Also, the n⁻-type second semiconductor layer 9 may be provided only to the termination structure separately from device design like the second embodiment.

The case of a trench-gate JFET has been described in the third embodiment, but similar effects can be obtained also in a normal JFET.

Fourth Embodiment

Figure 17:
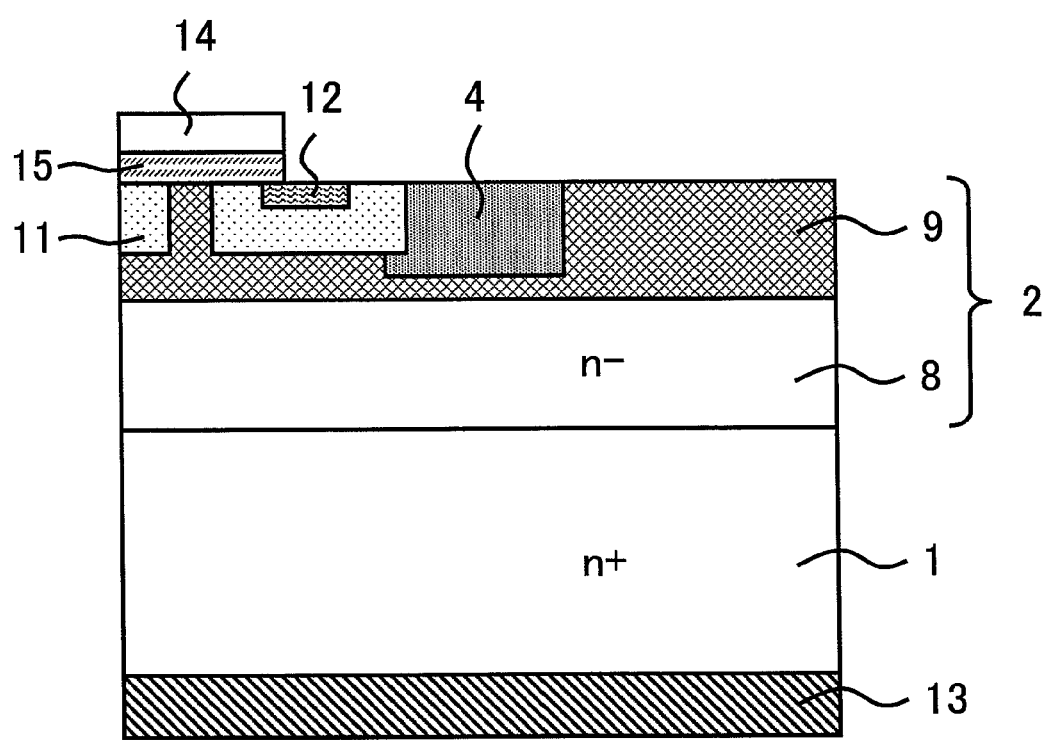
FIG. 17 is an explanatory diagram showing a sectional structure of a termination part of a semiconductor device of a fourth embodiment of the present invention.

FIG. 17 is an explanatory diagram showing a sectional structure of a semiconductor device of a fourth embodiment of the present invention. The fourth embodiment provides an example in which a so-called MOS field-effect transistor (MOSFET: Metal-Oxide-Semiconductor Field-Effect Transistor) is formed in an active region. For avoiding complications, the source electrode and the insulating film 7 for protecting the front surface are omitted. The semiconductor device of the fourth embodiment is different from a general MOSFET in that a stacked film formed of the n⁻-type first semiconductor layer 8 and the n⁻-type second semiconductor layer 9 whose impurity concentration is higher than that of the n⁻-type first semiconductor layer 8 is used as the n⁻-type SiC drift layer 2 and a p-type semiconductor region 11 and the JTE where the electric field may possibly concentrate are formed in the n⁻-type second semiconductor layer 9. The manufacturing method and structure other than those may be the same as those of the general MOSFET.

According to the structure of the fourth embodiment, since the impurity concentration of the region where a channel is formed is high, the channel resistance can be reduced, and the maximum electric field intensity $E_{Max}$ can be made higher than $E_{Max}$ of the n⁻-type first semiconductor layer 8, and therefore, a tradeoff between the withstand voltage and the resistance can be improved. Also, the n⁻-type second semiconductor layer 9 may be provided only to the termination structure separately from device design like the second embodiment.

The case of a normal MOSFET has been described in the fourth embodiment, but similar effects can be obtained also in the case of a trench-gate MOSFET in which a trench is formed and a gate insulating film and a gate electrode are formed in the trench.

Industrial Applicability

The present invention can be applied to a semiconductor device and in particular to a termination structure of a semiconductor device using silicon carbide.

The invention claimed is:

1. A semiconductor device comprising:
    a semiconductor substrate of a first conductivity type made of silicon carbide;
    a drift layer of the first conductivity type formed on the semiconductor substrate, the drift layer including a first semiconductor region with a first impurity concentration and a second semiconductor region with an impurity concentration higher than the first impurity concentration and in contact with a front surface;
    an active region where a current flows at the time of applying a voltage; and
    a third semiconductor region of a second conductivity type opposite to the first conductivity type, the third semiconductor region being formed on an outer circumferential part of the active region,
    wherein the second semiconductor region extends to the outer circumferential part, and
    the third semiconductor region is formed inside the second semiconductor region.

2. The semiconductor device according to claim 1, further comprising:
    a Schottky electrode formed on the active region and making a Schottky contact with the first semiconductor region; and
    a fourth semiconductor region of the second conductivity type formed near an edge of the Schottky electrode and in contact with the third semiconductor region,
    wherein the fourth semiconductor region is formed inside the second semiconductor region.

3. The semiconductor device according to claim 1, further comprising:
    a group of a plurality of fifth semiconductor regions of the second conductivity type arranged with a predetermined width and a predetermined interval near a front surface of the second semiconductor region of the active region.

4. The semiconductor device according to claim 1,
    wherein a JFET is formed in the active region, and a source region of the JFET is formed inside the second semiconductor region.

5. The semiconductor device according to claim 1,
    wherein a MOSFET is formed in the active region, and a source region of the MOSFET is formed inside the second semiconductor region.

6. A semiconductor device comprising:
    a semiconductor substrate of a first conductivity type made of silicon carbide;
    a drift layer of the first conductivity type with a first impurity concentration formed on the semiconductor substrate;
    an active region where a current flows at the time of applying a voltage;
    a first semiconductor region of a second conductivity type opposite to the first conductivity type, the first semiconductor region being formed on an outer circumferential part of the active region; and
    a second semiconductor region of the first conductivity type with an impurity concentration higher than the first impurity concentration,
    wherein an edge of the second semiconductor region located on a side away from the active region is surrounded from its bottom surface to its front surface by the first semiconductor region.

7. The semiconductor device according to claim 6,
    wherein the second semiconductor region has an edge in a range where the first semiconductor region is formed.

8. The semiconductor device according to claim 6, further comprising:
    a Schottky electrode formed on the active region and making a Schottky contact with the drift layer; and
    a third semiconductor region of the second conductivity type formed near an edge of the Schottky electrode and in contact with the first semiconductor region,
    wherein the second semiconductor region has an edge in a range where the third semiconductor region is formed.

9. The semiconductor device according to claim 6,
    wherein the second semiconductor region does not extend to the active region.

10. The semiconductor device according to claim 6,
    wherein a diode, a JFET, or a MOSFET is formed in the active region.

11. The semiconductor device according to claim 9, wherein a diode, a JFET, or a MOSFET is formed in the active region.

\* \* \* \* \*